United States Patent [19]

Fisher et al.

[11] Patent Number: 4,917,759

[45] Date of Patent: Apr. 17, 1990

[54] METHOD FOR FORMING SELF-ALIGNED VIAS IN MULTI-LEVEL METAL INTEGRATED CIRCUITS

[75] Inventors: Duncan M. Fisher; Jeffrey L. Klein, both of Austin, Tex.

[73] Assignee: Motorola, Inc., Schaumburg, Ill.

[21] Appl. No.: 339,451

[22] Filed: Apr. 17, 1989

[51] Int. Cl.⁴ .......................... C23F 1/02; B44C 1/22; C03C 15/00; C03C 25/06

[52] U.S. Cl. .................................. 156/643; 156/646; 156/652; 156/653; 156/656; 156/657; 156/659.1; 204/192.35; 204/192.37; 437/192

[58] Field of Search ............... 156/643, 644, 646, 652, 156/653, 656, 657, 659.1, 661.1, 664, 665, 662; 204/192.32, 192.35, 192.37; 427/38, 39; 252/79.1; 437/189, 190, 192, 194, 195

[56] References Cited

U.S. PATENT DOCUMENTS 4,670,091  6/1987  Thomas et al. ...................... 156/643

OTHER PUBLICATIONS

Reverse Pillar and Maskless Contact-Two Novel Recessed Metal Schemes and Their Comparisons To Conventional VLSI Metallization Schemes, J. L. Yeh et al., I.E.E.E., Jun. 13-14, 1988, V-Mic Conf., pp. 95-100.

Primary Examiner—William A. Powell
Attorney, Agent, or Firm—James L. Clingan, Jr.

[57] ABSTRACT

A process for forming a via in a semiconductor device using a self-aligned metal pillar to connect metal layers separated by a dielectric. A first aluminum layer is formed on an oxide layer overlying a semiconductor substrate, and a thin tungsten layer is formed and patterned overlying the first aluminum layer. The pattern in this tungsten layer will determine the pattern for the first level of metal interconnect to be formed later in the first aluminum layer. The tungsten layer is etched using the underlying first aluminum layer as an etch stop. A second aluminum layer is then formed overlying the patterned tungsten layer and the exposed regions of the first aluminum layer. In one continuous etching step the second aluminum layer is patterned and etched to form a pillar, and the first aluminum layer is etched to form the first level of metal interconnect in the semiconductor device using the pattern formed earlier in the tungsten layer and to expose regions of the oxide layer. A dielectric is deposited overlying the exposed regions of the oxide layer, the formed pillar, and the thin tungsten layer. This dielectric is etched back to expose the top of the pillar, and then a third aluminum layer is deposited overlying the dielectric to make electrical contact to the exposed surface of the pillar.

10 Claims, 4 Drawing Sheets

METHOD FOR FORMING SELF-ALIGNED VIAS IN MULTI-LEVEL METAL INTEGRATED CIRCUITS

BACKGROUND OF THE INVENTION

This invention relates generally to a process for fabricating semiconductor devices, and more specifically to processes for forming vias in semiconductor devices using self-aligned metal pillars.

Integrated circuits commonly use multi-level metal interconnect as a means for reducing the layout area required for the tens or hundreds of thousands of semiconductor devices that typically form an integrated circuit. This reduction in layout area is possible because the two or more metal layers used in multi-level metal schemes are separated by dielectric layers that allow crisscrossing of the separated metal layers without electrical shorting. Intentional connections between metal layers separated by a dielectric are created by forming small apertures in the dielectric and filling the aperture with a conducting material such as aluminum. These connections are usually made between consecutive metal layers and are known as vias.

As semiconductor device geometries continue to shrink into the submicron range, it is increasingly difficult to maintain planar metal and dielectric surfaces during the formation of multi-level metal interconnect. This lack of planarity can cause several problems. For instance, if the underlying topography coated by a photoresist layer contains abrupt steps due to poor planarity, the photoresist layer's thickness will not be uniform. This can occur, for example, when photoresist is applied to overlie features formed earlier in a semiconductor device process that protrude from the surface of a wafer. Photoresist cannot be applied uniformly over such a topography. This nonuniformity in thickness can lead to some regions of the patterned photoresist layer being inadequately thick to protect underlying features during a later etching step and other regions being excessively thick so that the full thickness of the photoresist layer cannot be exposed due to the depth-of-focus limitations of photolithography at sub-micron dimensions. Also, poor planarity of metal and dielectric layers promotes poor metal step coverage which increases metal sheet-resistance, susceptibility to current-stress stress failure, electromigration problems, and the probability of electrical opens. In addition, poor planarity in underlying metal or dielectric layers formed earlier in a semiconductor device process further increases the difficulty of establishing planarity in overlying metal or dielectric layers formed later in that process.

Another difficulty associated with via formation for multi-level metal interconnect in sub-micron semiconductor devices is the alignment of upper and lower metal layers with an aperture formed in a dielectric for a via. This alignment is difficult because of the small distance between device features in sub-micron devices and the reduced tolerance available for alignment errors. Misalignment of a via relative to connected upper and lower metal layers can lead to reduced device yield, increased via resistance, and poor metal step coverage in the via. For example, in a standard via, misalignment of the via relative to the lower metal layer results in overetching into the dielectric underlying the lower metal layer, thereby increasing the aspect ratio of the via opening and preventing adequate step coverage when later filling the via with metal; the result is a poor contact interface in the via and increased via resistance. Misalignment of an upper metal layer relative to a via results in overetching, or notching, of the lower metal layer; the notched lower metal layer exhibits increased current density and is thus more susceptible to failure from electromigration or current stress.

In many semiconductor devices, the layout dimensions of upper and lower metal layers connecting to vias are extended in the vicinity of the via to form a layout frame, or head, around the via. This is known as framing the via, and the frame provides additional alignment margin such that if partial misalignment of an upper and lower metal layer relative to the intended via location occurs, the actual formed via will still overlie a portion of a lower metal layer or underlie a portion of an upper metal layer. However, an adverse effect of using framed vias in a semiconductor device layout is that the packing density is substantially decreased (or the layout area is substantially increased).

Accordingly, a need existed for a method of forming a via for connecting multi-level interconnect in sub-micron semiconductor devices that improves the surface planarity of formed metal and dielectric layers and reduces problems associated with via misalignment.

It is therefore an object of this invention to provide an improved method for forming a via in a semiconductor device.

It is a further object of this invention to provide an improved method for forming a via that reduces problems associated with via misalignment.

Still another object of this invention is to provide an improved method for forming a via that improves yield and reliability.

A still further object of this invention is to provide an improved method for forming a via which improves step coverage.

BRIEF SUMMARY OF THE INVENTION

The foregoing and other objects and advantages of the present invention are achieved, in one specific embodiment, through a process for forming a via in a semiconductor device that uses a self-aligned metal pillar, for example aluminum, to connect metal layers separated by a dielectric such as silicon oxide. A first aluminum layer is formed on an oxide layer overlying a semiconductor substrate, and a thin tungsten layer is formed and patterned overlying the first aluminum layer. The pattern in this tungsten layer will determine the pattern for the first level of metal interconnect to be formed later in the first aluminum layer. The tungsten layer is etched using an etch chemistry which does not substantially react with aluminum. Thus, while etching the tungsten layer, the underlying first aluminum layer is used as an etch stop.

A second aluminum layer is then formed overlying the patterned tungsten layer and the exposed regions of the first aluminum layer. In one continuous etching step, using an etch chemistry that does not substantially react with tungsten, the second aluminum layer is patterned and etched to form a pillar, and the first aluminum layer is etched to form the first level of metal interconnect in the semiconductor device using the pattern formed earlier in the tungsten layer. During this single etch step, while etching the second aluminum layer, the underlying thin tungsten layer is used as an etch stop; while etching the first aluminum layer, the overlying thin tungsten layer is used an etch mask to define the desired pattern in the first aluminum layer and the underlying oxide layer is used as an etch stop. A dielectric is deposited overlying the exposed regions of the oxide layer, the formed pillar, and the thin tungsten layer. This dielectric is etched back to expose the top of the pillar, and then a third aluminum layer is deposited overlying the dielectric to make electrical contact to the exposed surface of the pillar.

DETAILED DESCRIPTION OF THE PREFERRED EMBODIMENTS

Figure 1:
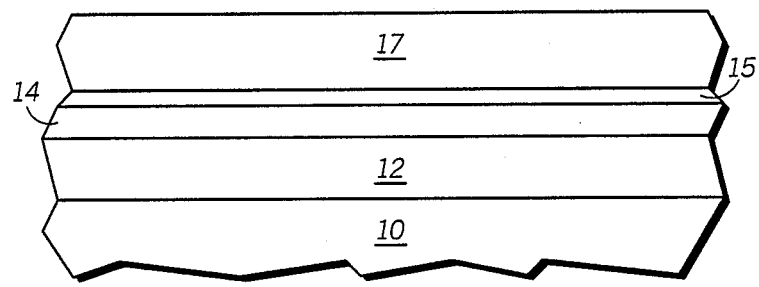
FIGS. 1-6 illustrate process steps, in cross-section, in accordance with one embodiment of the invention.

FIGS. 1-6 illustrate, in cross-section, a process for forming a self-aligned aluminum pillar for use as a via to connect upper and lower layers of metal interconnect in a semiconductor device using double-level metal in accordance with one specific embodiment of the invention. In this process, a first oxide layer 12 is deposited overlying a semiconductor substrate 10, and a first aluminum layer 14 is deposited overlying first oxide layer 12. Next, a thin tungsten layer 15 is deposited overlying first aluminum layer 14. Tungsten layer 15 is patterned leaving a tungsten portion 16 as desired for the first level of metal interconnect to be formed later in first aluminum layer 14, and a second aluminum layer 20 is deposited overlying tungsten portion 16. Second aluminum layer 20 is patterned to form a pillar 21 which will be used as a via in the completed device, and first aluminum layer 14 is patterned to form the first level of metal interconnect using the pattern formed earlier in tungsten portion 16. A second oxide layer 24 is deposited overlying exposed first oxide layer 12 and tungsten portion 16, and then etched back to expose the top surface of pillar 21. Finally, a third aluminum layer 26 is deposited overlying second oxide layer 24 to contact the top surface of pillar 21, thus connecting two levels of metal interconnect in a semiconductor device. This embodiment shows the formed pillar framed by both the upper and lower metal layers. It is not required in the method of the invention that the formed pillar be framed by both or earlier of these metal layers.

Referring to FIG. 1, a first oxide layer 12 is formed overlying a silicon substrate 10. Even though only first oxide layer 12 is shown formed overlying substrate 10, it is possible for numerous structures such as field oxide regions, polysilicon interconnect, gate electrodes, and active device regions to underlie first oxide layer 12. These underlying structures do not directly affect the practice of the invention because first oxide layer 12 is planarized using a conventional etch back method before forming overlying layers thereon. For example, first oxide layer 12 can be a deposited BPSG layer planarized by an etch back with photoresist as is known. Next in the process, a first aluminum layer 14 is deposited overlying first oxide layer 12, and a thin tungsten layer 15 is deposited overlying first aluminum layer 14. A photoresist layer 17 is deposited on the surface of tungsten layer 15.

Figure 2:
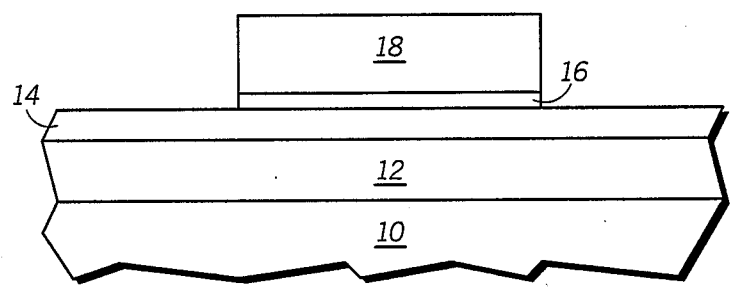

Referring to FIG. 2, photoresist layer 17 has been patterned using conventional photolithography leaving a photoresist portion 18. Tungsten layer 15 has been etched with a flourine-based chemistry such as $SF_6$, $CF_4$, or $NF_3$ using photoresist portion 18 as an etch mask leaving tunsten portion 16. The pattern etched into tungsten portion 16 is the pattern desired for the first layer of metal interconnect to be formed later in first aluminum layer 14. The etch chemistry used to etch tungsten layer 15 is substantially unreactive with first aluminum layer 14, and thus first aluminum layer 14 acts as an etch stop during this etching. Following the etching of tungsten layer 15, the top surfaces of first aluminum layer 14 not covered by tungsten portion 16 are exposed.

The surface topography of tungsten layer 15 is substantially flat because first oxide layer 12 has been planarized earlier in the process, first aluminum layer 14 is of substantially uniform thickness, and tungsten layer 15 is thin relative to first aluminum layer 14. Thus, photoresist layer 17 can be deposited overlying tungsten layer 15 with a substantially uniform thickness. This uniformity improves the manufacturability of the semiconductor device by reducing variation in the photolithography process used to obtain photoresist portion 18 and in the etching to obtain tungsten portion 16. This variation is reduced because there are no excessively thick regions of photoresist layer 17 that will be adequately exposed due to depth-of-focus limitations of photolithography at sub-micron dimensions, and there are no excessively thin regions of photoresist layer 17 that will inadequately protect tungsten portion 16 during etching.

Figure 3:
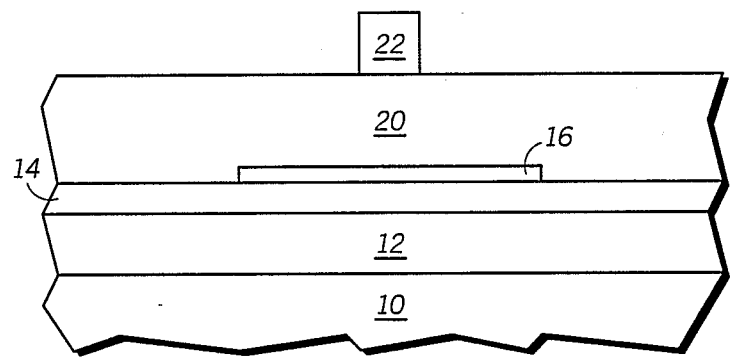

In FIG. 3 a second aluminum layer 20 is deposited overlying patterned tungsten layer 16 and the exposed surfaces of first aluminum layer 14. In this aluminum deposition step, the top surface of tungsten layer 16 is cleaned by an in-situ process such as sputter cleaning with argon immediately preceding aluminum deposition to remove any native oxide that may have formed. A photoresist layer is deposited overlying second aluminum layer 20 and patterned using conventional photolithography leaving a photoresist portion 22. The top surface of second aluminum layer 20 is substantially planar because second aluminum layer 20 is deposited with substantially uniform thickness and tungsten layer 16 is sufficiently thin to maintain planarity on the top surface of aluminum layer 20. Also, tungsten portion 16 and first aluminum layer 14, which underlie second aluminum layer 20, are substantially planar as described above. Due to this planarity, the photoresist layer is deposited with substantially uniform thickness. This photoresist layer is not substantially distorted because the underlying topography is substantially planar and has no substantially protruding features which would cause distortion.

By the method of the present invention, and as with the photoresist layer from which photoresist portion 18 was formed previously, uniformity in the photoresist layer from which photoresist portion 22 was formed improves the manufacturability of the semiconductor device by reducing variation in the photolithography process used to obtain photoresist portion 22 and in the etching of second aluminum layer 20. This variation is reduced because there are no excessively thick regions of this photoresist layer that will be inadequately exposed due to depth-of-focus limitations of photolithography at sub-micron dimensions, and there are no excessively thin regions of this photoresist layer that will inadequately protect second aluminum layer 20 during etching.

Figure 4:
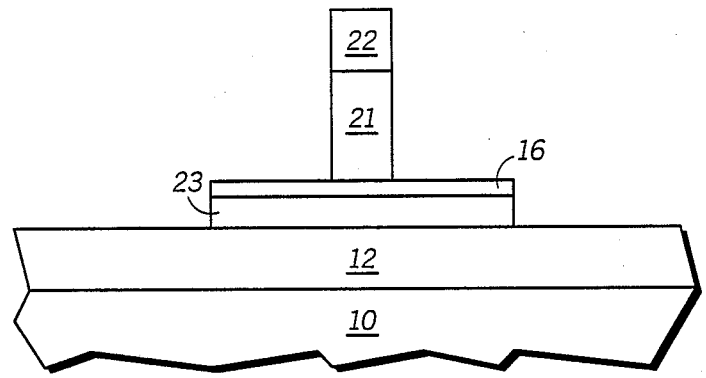

With reference to FIG. 4, first and second aluminum layers 14 and 20, respectively, are sequentially etched in a continuous etch step using a single etch chemistry that is substantially unreactive with tungsten. Second aluminum layer 20 is etched to form a pillar 21; during this etch, photoresist portion 22 is used as an etch mask and tungsten portion 16 is used as an etch stop. This etch step continues to etch first aluminum layer 14 with the same etch chemistry using tungsten portion 16 as an etch mask and first oxide layer 12 as an etch stop. This etch leaves an aluminum portion 23 under tungsten portion 16. Also, this etch is anisotropic and uses a chlorine-based chemistry such as $Cl_2$, $BCl_3$, or HCl. Following this etching step, regions of first oxide layer 12 not covered by tungsten portion 16 and aluminum portion 23 are exposed. Thus, in accordance with the invention, a self-aligned aluminum pillar has been formed which will connect a first level of metal interconnect and a second level of metal interconnect to be formed later in the process. The formed aluminum pillar adheres well to the underlying tungsten layer without any induced stresses in the pillar, thus problems with pillar deformation or flaking are avoided.

Some regions of the top surface of tungsten portion 16 will be exposed after the overlying regions of second aluminum layer 20 not protected by photoresist portion 22 are removed during etching. Although the etch chemistry used is substantially unreactive with tungsten, some of tungsten portion 16 will gradually be removed after its top surface is thus exposed. Therefore, tungsten portion 16 must be sufficiently thick to protect underlying first aluminum layer 14 until the regions of first aluminum layer 14 not covered by tungsten portion 16 are completely etched away. For example, the etch chemistry selectivity ratio for aluminum relative to tungsten is about 10:1. Thus, the thickness of tungsten portion 16 must be about one-tenth or more of the thickness of first aluminum layer 14 in order to protect the underlying regions thereof during etching.

Because photoresist portion 22 must remain intact during the etching of both first and second aluminum layers 14 and 20, in other embodiments of the invention it may be desirable to use a conventional hard mask to reinforce photoresist portion 22 during this etching process as is known in the art. For example, the use of a hard mask may be necessary when etching greater than a combined thickness of 1200 nm of aluminum to substantially maintain the originally patterned dimensions in photoresist portion 22.

Figure 5:
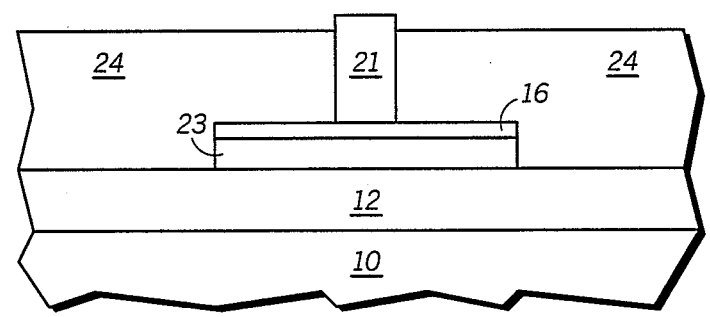

In FIG. 5 a second oxide layer 24 is deposited overlying patterned tungsten portion 16 and the exposed regions of first oxide layer 12 to completely cover pillar 21. Second oxide layer 24 is then etched back as known in the art to planarize the surface thereof and to expose a small portion of the top of pillar 21. For example, second oxide layer 24 can be a low temperature oxide which is planarized by applying a coat of photoresist and etching back the photoresist and glass with equal etch selectivity, as is known.

Figure 6:
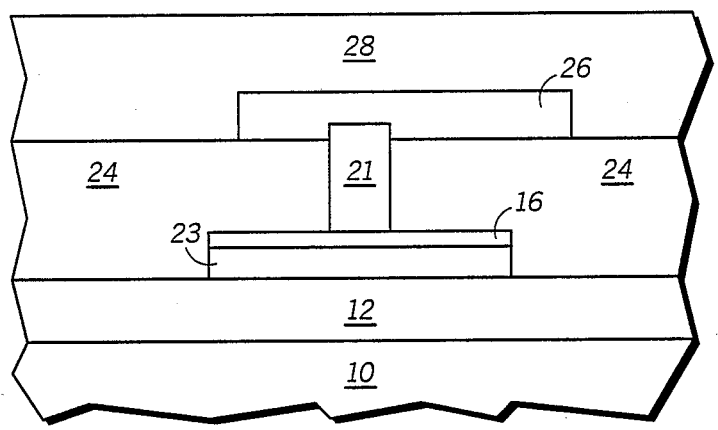

Referring to FIG. 6, a third aluminum layer is deposited overlying second oxide layer 24 and the exposed surfaces a pillar 21 to make electrical contact. The third aluminum layer is then patterned using a photoresist to form an aluminum portion 26 which is covered with a passivation layer 28 using conventional methods. Because underlying second oxide layer 24 has been planarized, and only a relatively thin portion of pillar 21 protrudes above the surface of second oxide layer 24, the third aluminum layer is deposited with substantially uniform thickness, coverage, and surface planarity.

It should be noted that all metal, photoresist, and dielectric layers deposited in the practice of the invention can be deposited onto substantially planar underlying surfaces or etched back in a planarization step, thus increasing the manufacturability and reliability of the formed semiconductor device. It is well recognized that maintaining planarization during the formation of multilevel interconnection is critical to the successful manufacture of sub-micron semiconductor devices.

Figure 7:
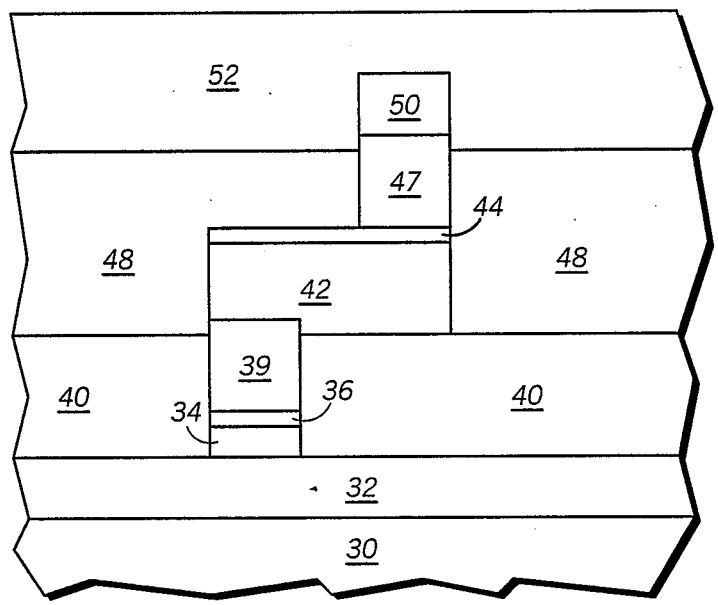
FIG. 7 illustrates a semiconductor device, in cross-section, fabricated in accordance with another embodiment of the invention.

FIG. 7 illustrates, in cross-section, a semiconductor device using triple-level metal and two self-aligned tungsten pillars as vias formed in another embodiment of the invention. The first and second vias are formed by essentially the same method as illustrated in FIGS. 1-6 above, however tungsten and aluminum have been interchanged as the metals used in the metal layers formed in the semiconductor device; tungsten forms the three levels of metal interconnect in this device and aluminum forms the thin metal layers located at the base of the two pillars. Also, in this embodiment, a first via is illustrated which is not framed by the respective lower metal layer, and a second via is illustrated which is not framed by the respective upper metal layer. Vias formed without an upper or lower metal layer frame are known as zero-framed vias. In other embodiments it is possible that a zero-framed via be formed that is not framed by either the upper or lower metal layers.

In the embodiment illustrated in FIG. 7, a first oxide layer 32 is deposited overlying a semiconductor substrate 30. A first tungsten portion 34 and a first aluminum portion 36 are formed as discussed in the previous embodiment. First tungsten portion 34 overlies first oxide layer 32, and first aluminum portion 36 overlies first tungsten portion 34. A second tungsten layer is deposited and patterned to form a first pillar 39 overlying the patterned first aluminum portion 36. First pillar 39 will be used as a via in the completed device. First tungsten portion 34 is patterned to form a first level of metal interconnect during the same etch which forms first pillar 39. A second oxide layer 40 is deposited overlying the exposed regions of first oxide layer 32 and first pillar 39. Second oxide layer 40 is then etched back to expose the top of first pillar 39.

The formation of the second via begins following the etch back of second oxide layer 40 and repeats the method of the invention illustrated for FIGS. 1-6. Second oxide layer 40 has been planarized and provides a suitable surface for forming a second via by this method. To start the formation of the second via, a third tungsten portion 42 is formed overlying second oxide layer 40 and the exposed regions of first pillar 39 to contact the top thereof, and a second thin aluminum portion 44 is formed overlying third tungsten portion 42 using the same method as illustrated in FIGS. 1-6 above. A fourth tungsten layer is deposited and patterned to form a second pillar 47 overlying second aluminum portion 44 which will be used as another via. Third tungsten portion 42 is patterned during the same etch forming second pillar 47 to form a second level of metal interconnect. A third oxide layer 48 is deposited overlying the exposed regions of second oxide layer 40, second aluminum portion 44, and second pillar 47. A fifth tungsten portion 50 is then formed overlying third oxide layer 48 and the exposed regions of second pillar 47 to make electrical contact. Fifth tungsten portion 50 acts as a third level of metal interconnect in the semiconductor device, and a passivation layer 52 is formed overlying the exposed regions of third oxide layer 48 and fifth tungsten portion 50.

Thus, in this embodiment, two vias are formed in a semiconductor device having multi-level metal interconnect. In the first via, pillar 39 is formed without any framing by portions 34 or 36; the horizontal dimension of pillar 39 is equal to the horizontal dimension of portions 34 and 36. In the second via, pillar 47 is not framed by upper metal portion 50. It is possible to form vias by the present invention which are not framed by either the upper or lower metal layers. This could be advantageous for use in a semiconductor device requiring tight layout because the use of vias not framed by either upper or lower metal layers can substantially increase device packing density.

Though the practice of the invention has been illustrated for double-level and triple-level metal semiconductor devices, the invention can be practiced to form any number of levels of metal interconnect in a multilevel semiconductor device, and such practice is considered to be within the scope of the invention. Also, the dielectric layers used in other embodiments could be any of a number of low temperature oxides or nitrides such as phosphosilicate glass (PSG), borosilicate glass (BSG), boro-phosphosilicate glass (BPSG), plasma-enhanced oxide (PEO), or plasma-enhanced nitride (PEN).

In other embodiments of the invention, some or all of the metal layers used in the practice of the invention could be formed from different metals. For example, the pillars could be formed from aluminum, the thin conducting layer at the base of the pillars could be formed from tungsten, and the layers of metal interconnect could be formed from titanium or a titanium-tungsten alloy. Aluminum, tungsten, titanium, or combinations thereof could be used in other parts of the formed semiconductor device. There are many combinations of metals that all fall within the scope of the invention. The practice of the invention only requires that a thin conducting metal layer, which acts as an etch stop for an overlying conducting layer and as an etch mask for an underlying layer of metal interconnect, be formed at the base of a pillar-shaped via.

The via of the present invention is formed by depositing a metal layer, removing surrounding metal not protected by photoresist to form a metal pillar, and then depositing a dielectric around this formed pillar. This method of forming a via is known as forming a positive hole (in this use, hole refers to a metal pillar passing through a surrounding dielectric layer). On the other hand, in a standard via formation process an aperture is formed in a dielectric layer and then filled with a metal. This method of forming a via is known as forming a negative hole. At sub-micron geometries a positive hole process, such as the present invention, is preferable to a negative hole process because a positive hole process provides a solidly-filled metal via whereas a negative hole process provides a partially-filled metal via exhibiting poor metal step coverage. This poor step coverage is due to the high aspect ratio necessarily characteristic of an opening formed in a dielectric layer for a sub-micron device.

Figure 8:
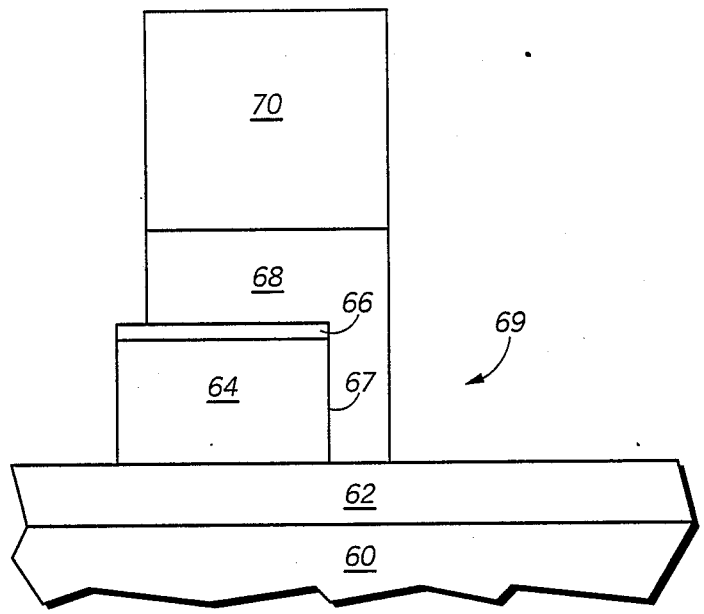
FIGS. 8 and 9 illustrate intermediate process steps, in cross-section, in the formation of partially misaligned vias demonstrating self-aligning advantages of the invention.
Figure 9:
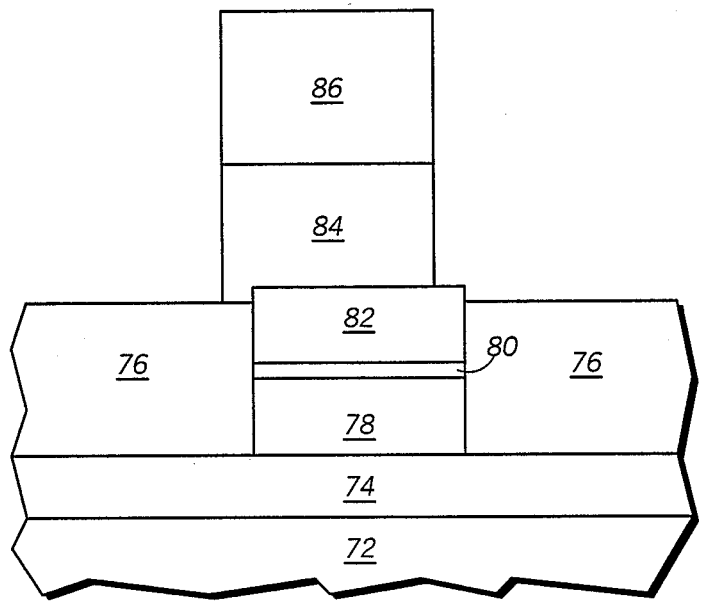

An important advantage of the present invention is the self-alignment of the formed via despite partial misalignment during the formation thereof. FIGS. 8 and 9 illustrate that adequate via quality is maintained during via formation in case of partial misalignment of a via relative to an underlying lower metal layer or of an upper metal layer relative to an underlying via.

FIG. 8 illustrates an intermediate step in the formation of a zero-framed via by the method of the invention previously illustrated in FIGS. 1-6. A first oxide layer 62 has been formed overlying a substrate 60. A first aluminum layer and a thin tungsten layer have been deposited and patterned overlying first oxide layer 62 leaving a first aluminum portion 64 and a tungsten portion 66. A second aluminum layer has been deposited and patterned to form a pillar 68 using a photoresist portion 70. Photoresist portion 70 has been partially misaligned relative to thin tungsten portion 66 and first aluminum portion 64. However, despite this misalignment, pillar 68 maintains its full horizontal dimension as defined by photoresist portion 70, and a portion 69 of pillar 68, extending horizontally beyond the edge 67 of patterned portions 64 and 66, extends vertically down the side of edge 67 of first oxide layer 62. Thus, the contact interface between pillar 68 and portions 64 and 66 at edge 67 provides an additional current path to offset any possible current density increase resulting from misalignment of pillar 68. Also, there is not etching of first oxide layer 62 or thin tungsten portion 66 resulting from the misalignment of pillar 68 because by the method of the invention portion 66 and layer 62 are etch stops during the etch which forms pillar 68 (the positive hole process used only requires the etching of metal to form the via).

FIG. 9 illustrates an intermediate step in the formation of a zero-framed via by the method of the invention previously illustrated in FIGS. 1-6 except that a different order of metals is used. A first oxide layer 74 has been formed overlying a substrate 72. A first tungsten layer and a thin first aluminum layer have been deposited and patterned overlying first oxide layer 74 leaving a first tungsten portion 78 and a first aluminum portion 80. A second tungsten layer has been deposited and patterned to form a pillar 82, and a second oxide layer 76 has been deposited and etched back to expose the top of pillar 82. A second aluminum portion 84 has been formed using a photoresist portion 86. Photoresist portion 86 has been partially misaligned relative to pillar 82, but second aluminum portion 84 maintains its full horizontal dimension as defined by photoresist portion 86. There is substantially no etching of tungsten pillar 82 or second oxide layer 76 during the patterning of second aluminum portion 84 because, by the method of the invention, pillar 82 and second oxide layer 76 are substantially unreactive with the etchant used during the etch which forms second aluminum portion 84 and thus act as etch stops during this etching. In contrast to the method of the invention, misalignment in a standard via process can result in the etching of the regions of a lower metal layer exposed through a via in the dielectric layer between upper and lower metal layers. This undesirable etching of the lower metal can occur if the photoresist which is used to pattern the upper metal layer is patterned in such way as to not cover the entire via. In such case the etchant reaches the lower metal through the portion of the via not covered by the patterned photoresist.

Thus, by the above advantages, the self-alignment of the via formed by the present invention ensures that a reliable via can be formed between the upper and lower metal layers of interconnect despite partial misalignment. Therefore, vias formed by the present invention can use zero-framed layout not requiring the use of extra misalignment tolerance added to the width of metal layers connecting to vias (layout of zero-framed vias is also known as layout of headless vias), thereby allowing metal lines to be more tightly-packed in an integrated circuit layout.

As a specific, but non-limiting, example which further illustrates preferred embodiments of the invention, the method of the invention as illustrated in FIGS. 1–6 is used to form a via in a semiconductor device. A silicon wafer is provided having first oxide layer consisting of a BPSG layer of 600 nm thickness overlying a lower temperature oxide layer of 100 nm thickness. This first oxide layer is cleaned with an in-situ clean preceding metal deposition to remove about 15 nm of oxide. A first aluminum layer is formed overlying a titanium nitride layer by depositing 75 nm of titanium nitride followed by 600 nm of aluminum. The top surface of the first aluminum layer is cleaned by an in-situ clean to remove any native oxide that might be present, and a thin tungsten layer of 100 nm thickness is deposited overlying the first aluminum layer.

A photoresist layer of 1050 nm thickness is applied overlying the thin tungsten layer, exposed, and developed. The thin tungsten layer is then patterned using a 100 nm tungsten etch with a 20 percent over-etch margin. Following another in-situ clean to remove any present native oxide, 700 nm of aluminum is deposited overlying the patterned thin tungsten layer to form a second aluminum layer. A photoresist layer of 1800 nm thickness is applied overlying the second aluminum layer. An aluminum pillar and the first aluminum and titanium nitride layers are etched and patterned to form a first level of metal interconnect and a via in one continuous etch step using a target etch of 1400 nm of aluminum with a 20 percent over-etch margin. A second oxide layer is formed by the deposition of 1800 nm of PEO. This second oxide layer is covered with 1800 nm of photoresist and then planarized with a combined photoresist/PEO etchant chemistry as is known using an etch target of 2800 nm with a 10 percent over-etch margin. A third aluminum layer of 700 nm thickness is deposited and patterned to form a second level of interconnect and to contact the formed aluminum pillar. A passivation layer of 1500 nm is deposited as is known in the art.

In the above-described embodiments, the method of the invention has been shown to be easily integrated into many processes for manufacturing semiconductor devices. There are only two additional processing steps required in the practice of the invention relative to a conventional via process; these are the deposition of the thin etch stop layer used at the base of the pillar-shaped via the deposition of the layer used to form the pillar. No additional photolithography steps or masks are required. The use of a thin etch stop layer has been shown to enable the formation of multi-level interconnect and vias with substantial planarization throughout an entire sub-micron semiconductor device fabrication process.

Although particular embodiments of the invention have been described in the foregoing description, it will be apparent to one skilled in the art that numerous modifications and variations can be made to the presented embodiments which still fall within the spirit and scope of the invention. Accordingly, it is intended that all such variations and modifications as fall within the scope of the appended claims be included within the invention.

We claim:

1. A method for forming a via in a semiconductor device comprising the steps of:
   providing a semiconductor substrate;
   forming a first conducting layer overlying said substrate;
   forming a second conducting layer of a material different from said first conducting layer overlying said first conducting layer;
   etching a portion of said second conducting layer using said first conducting layer as an etch stop to form a patterned portion of said second conducting layer;
   forming a third conducting layer of material different from said second conducting layer overlying said patterned portion of said second conducting layer; and
   etching a portion of said third conducting layer using said patterned portion of said second conducting layer as an etch stop to form a pillar wherein said etching selectively etches said third connecting layer substantially more than said patterned portion of said second conducting layer.

2. The method of claim 1 further comprising the steps of:
   etching a portion of said first conducting layer using said patterned portion of said second conducting layer as an etch mask to form a patterned portion of said first conducting layer;
   depositing a dielectric layer overlying said patterned portion of said second conducting layer and said pillar;
   etching back said dielectric layer to expose a top surface of said pillar; and
   forming a fourth conducting layer overlying said exposed top surface of said pillar.

3. The method of claim 1 wherein said step of forming a first conducting layer comprises forming a layer selected from the group consisting of aluminum, tungsten, titanium, and combinations thereof.

4. The method of claim 1 wherein said step of forming a second conducting layer comprises forming a layer selected from the group consisting of aluminum, tungsten, titanium, and combinations thereof.

5. The method of claim 1 wherein said step of forming a third conducting layer comprises forming a layer selected from the group consisting of aluminum, tungsten, titanium, and combinations thereof.

6. The method of claim 1 wherein said step of etching said third conducting layer comprises etching anisotropically.

7. The method of claim 2 wherein said step of depositing a dielectric layer comprises depositing a layer selected from the group consisting of PEO, PSG, BSG, BPSG, and PEN.

8. A method for forming a via in a semiconductor device comprising the steps of:
   providing a semiconductor substrate;
   forming a first conducting layer overlying said substrate;
   forming a second conducting layer of a material different from said first conducting layer overlying said first conducting layer;
   selectively etching said second conducting layer using said first conducting layer as an etch stop to form a patterned portion of said second conducting layer wherein said etching selectively etches said second conducting layer substantially more than said first conducting layer;

forming a third conducting layer of a material different from said second conducting layer overlying said patterned portion of said second conducting layer; and selectively etching said third conducting layer using said patterned portion of said second conducting layer as an etch stop to form a pillar and etching said first conducting layer using said second conducting layer as an etch mask, said first and third conducting layers being etched with the same etch chemistry in a continuous etch step, wherein said etching selectively etches said first and third conducting layers substantially more than said patterned portion of said second conducting layer.

9. The method of claim 8 further comprising the steps of:

depositing a dielectric layer overlying said patterned portion of said second conducting layer and said pillar;

etching back said dielectric layer to expose a top surface of said pillar; and forming a fourth conducting layer overlying said exposed top surface of said pillar.

10. A method for forming a via in a semiconductor device comprising the steps of:

providing a first dielectric layer overlying a semiconductor substrate;

forming a first conducting layer of a first metal overlying said first dielectric layer;

forming a second conducting layer of a second metal overlying said first conducting layer;

selectively etching said second conducting layer using said first conducting layer as an etch stop to form a patterned portion of said second conducting layer;

forming a third conducting layer of said first metal overlying said patterned portion of said second conducting layer;

selectively etching said third conducting layer to form a pillar using said patterned portion of said second conducting layer as an etch stop, and etching said first conducting layer using said patterned portion of said second conducting layer as an etch mask and said first dielectric layer as an etch stop, said first and third conducting layers being etched with the same etch chemistry in a continuous etch step, wherein said etching selectively etches said first and third conducting layers substantially more than said patterned portion of said second conducting layer;

depositing a second dielectric layer overlying said pillar;

etching back said second dielectric layer to expose a top surface of said pillar and to substantially planarize a top surface of said second dielectric layer; and forming a fourth conducting layer overlying said planarized top surface of said second dielectric layer to make electrical contact to said exposed top surface of said pillar.

* * * * *